United States Patent [19]

Lawandy

[11] Patent Number: 5,434,878
[45] Date of Patent: Jul. 18, 1995

[54] OPTICAL GAIN MEDIUM HAVING DOPED NANOCRYSTALS OF SEMICONDUCTORS AND ALSO OPTICAL SCATTERERS

[75] Inventor: Nabil R. Lawandy, Providence, R.I.

[73] Assignee: Brown University Research Foundation, Providence, R.I.

[21] Appl. No.: 210,356

[22] Filed: Mar. 18, 1994

[51] Int. Cl.[6] .................. H01S 3/091; H01S 3/17; H01S 3/18; H01S 3/20
[52] U.S. Cl. .......................... 372/43; 372/4; 372/41; 372/22; 372/25
[58] Field of Search .............. 372/22, 25, 51, 53, 372/43, 41, 40, 54; 359/326

[56] References Cited

U.S. PATENT DOCUMENTS

| H437 | 2/1988 | Conrad | 372/53 |
|---|---|---|---|
| H483 | 6/1988 | Moran et al. | 372/53 |
| 3,706,051 | 12/1972 | Collier et al. | 331/94.5 |
| 3,745,484 | 7/1973 | Caristi | 331/94.5 |
| 3,818,371 | 6/1974 | Herz et al. | 331/94.5 |
| 3,938,058 | 2/1976 | Yamamoto | 331/94.5 |
| 4,229,078 | 10/1980 | Bly et al. | 350/353 |
| 4,646,308 | 2/1987 | Kafka et al. | 372/25 |
| 4,685,802 | 8/1987 | Saito et al. | 356/339 |
| 4,853,937 | 8/1989 | Rinke et al. | 372/53 |
| 5,023,139 | 6/1991 | Birnboim et al. | 428/402 |
| 5,121,398 | 6/1992 | Rao | 372/20 |
| 5,157,674 | 10/1992 | Lawandy | 372/22 |
| 5,233,621 | 8/1993 | Lawandy | 372/22 |
| 5,253,258 | 10/1993 | Lawandy | 372/22 |

FOREIGN PATENT DOCUMENTS 63-233592(A) 9/1988 Japan .

OTHER PUBLICATIONS

USSR Academy of Science 10 Feb. 1967 "Stimulated Emission of An Ensemble of Scattering Particles with Negative Absorption" by V. S. Letokhov.
Journal of Applied Physics vol. 41, No. 11, Oct. 1970 "Transmission Losses in Aprotic Liquid Lasers", C. Brecher, K. French, W. Watson, and D. Miller pp. 4578–4581.
Sylvania Precision Materials, Towanda Pa., (Temporary Data Sheet) "Laser Liquid" Jun. 3, 1970.
Optical Properties of Manganese-Doped Nanocrystals of ZnS, in The American Physical Society vol. 72, No. 3, Jan. 17, 1994 by R. N. Bhargava and D. Gallagher.
"Doped Nanocrystals of Semiconductors-A New Class of Luminescent Materials" 1993 International Conference on Luminescence, TH1B-2, Aug. 9–13, 1993, Univ. of Conn. by R. N. Bhargava.
Non-Resonant Feedback in Lasers by R. V. Ambartsumyan, N. G. Basov, P. G. Kryukov and V. S. Letokhov in Progress in Quantum Electronics, 109–185 Pergamon Press, Oxford 1970 No Month Available.
Journal Appl. Phys, 1972, pp. 1699–1708 "Brillouin and Rayleigh Scattering in Aprotic Laser Solutions Containing Neodymium" by R. Pappalardo and A. Lempicki Apr. 1992.

(List continued on next page.)

*Primary Examiner*—Rodney B. Bovernick
*Assistant Examiner*—Robert McNutt
*Attorney, Agent, or Firm*—Perman & Green

[57] ABSTRACT

An optical gain medium comprises a multi-phase system wherein: a first phase is an electromagnetic radiation emitting and amplifying phase (16) that is comprised of doped semiconductor nanocrystals; a second phase is an electromagnetic radiation scattering phase (14); and a third phase is a substantially transparent (at the wavelengths of interest) matrix phase (12). The emission phase may consist of ZnS nanoparticles that are doped with $Mn^{2+}$, the scattering phase may comprise $TiO_2$ or $Al_2O_3$ nanoparticles, and the matrix phase may comprise a glass or polymer body, layer or coating. At least one dimension of a body, layer, or coating comprised of the gain medium may be less than a scattering length associated with the scattering phase.

44 Claims, 2 Drawing Sheets

OTHER PUBLICATIONS

Opticall and Quantum Electronics, No. 3 May 1975 "Airborne laser radar for mapping two-dimensional contours of aerosol concentration" by G. W. Grams, E. M. Patterson and C. M. Wyman pp. 187–191.

Journal Am. Chem. Soc. 1993, 115, 8706–8715, Synthesis and Characterization of Nearly Monodisperse CdE (E=S, Se, Te) Semiconductor Nanocrystallites by C. B. Murray, D. J. Norris and M. G. Bawendi Mar. 22, 1993.

Generation of Light by a Scattering Medium with Negative Resonance Absorption, Sov. Phys. JETP, vol. 26, No. 4, Apr. 1968, pp. 835–839.

"Generation of Simulated Noncoherent Radiation in Light–Scattering Media Exhibiting Chemical Reactions", Sov. J. Quantum Electron, 12(5), May 1982, pp. 588–594.

OPTICAL GAIN MEDIUM HAVING DOPED NANOCRYSTALS OF SEMICONDUCTORS AND ALSO OPTICAL SCATTERERS

CROSS-REFERENCE TO A RELATED PATENT APPLICATION:

This patent application is related to a copending patent application Ser. No. 08/210,710, filed Mar. 19, 1994, entitled "Optical Sources Having a Strongly Scattering Gain Medium Providing Laser-Like Action", by Nabil M Lawandy.

1. Field of the Invention

This invention relates generally to sources of electromagnetic energy and, in particular, the invention relates to highly monochromatic sources (narrow spectral linewidth).

2. BACKGROUND OF THE INVENTION

In a publication entitled "Generation of light by a scattering medium with negative resonance absorption", Sov. Phys. JETP, Vol. 26, No. 4, April 1968 (pps. 835–839), V. S. Letokhov presents a theoretical analysis of the generation of light by a scattering medium with negative resonance absorption or gain. This analysis requires that a photon mean free path ($\Lambda_s$) be much smaller than all of the dimensions (R) of the active scattering region (equation 1). In a discussion of a condition for a generation threshold, an example is provided for an optically excited spherical distribution of ruby particles ($\lambda = 7 \times 10^{-5}$ cm) with radius $2 \times 10^{-4}$ cm, and the resulting critical radius of the region is shown to be approximately 4 mm. Letokhov also provides a theoretical analysis of scattering particles that are distributed in a gaseous medium with negative absorption, such as a He—Ne or He—Xe gas mixture excited by an electric discharge. The scattering particles are said to effect a non-resonant feedback, while the gaseous active medium effects resonant amplification. The critical effective radius for such a gaseous medium is said to be approximately 1.8 cm. A continuous narrowing of the emission spectrum predicted.

Reference in this regard is also made to an earlier theoretical paper by Letokhov, "Stimulated emission of an ensemble of scattering particles with negative absorption", ZhETF Plasma 5, No. 8, 15 Apr. 1967, (pps. 262–265), wherein the dimensions of the medium are given as $R \gg \Lambda_s \gg \lambda$ where, as before, R is the dimensions of the medium, $\Lambda_s$ is the mean free path of a photon due to scattering, and $\lambda$ is the wavelength of the photon.

Reference is also made to a publication by Ambartsumyan R. V., Basov N. G., Kryukov P. G. & Letokhov V. S. in Progress in Quantum Electronics (ed. Sanders J. H. & Stevens K. W. H.) 109–185 (Pergamon Press, Oxford, 1970), where a theoretical presentation is made at pages 152–153 of a case when the free path of a photon due to scattering, $\Lambda_s \sim 1/Q_s N_0$, the average dimension of the region occupied by a cloud, R, and the wavelength of the emission $\lambda$ satisfy the relation $$R > \Lambda_s > \lambda,$$

and where the mean distance between the scattering particles is much greater than the wavelength.

One problem that is apparent in the approach of Letokhov is that all of the dimensions of the medium must be much greater than the scattering length. By example, each dimension of the medium may be required to be on the order of a centimeter. These dimensional requirements would preclude the use of the medium for many valuable high spatial resolution applications.

By example, one particularly valuable application which could not be achieved in accordance with the teachings of Letokhov is the formation of a thin layer, coating, or body that included an optical gain medium. Another example is a sphere or cylinder whose radius was comparable to or smaller than the scattering length.

A further problem is the requirement of providing scattering particles in a gaseous medium, particularly one that is excited by an electrical discharge. This may be difficult to achieve in practice, and may be impractical for most applications.

Reference is also made to an article entitled "Generation of stimulated noncoherent radiation in light-scattering media exhibiting chemical reactions", Sov. J. Quantum Electron. 12(5), May 1982, (pps. 588–594), wherein I. A. Izmailov et al. propose that a feedback resulting from scattering be used to achieve lasing in a disperse reactive medium. The feasibility of chemically pumping the laser is estimated on the basis of calculations of the heterophase burning of a drop of fuel in an oxidizing atmosphere. The reactions between NO and $O_3$, Ba and $S_2Cl_2$, and Ba and $N_2O$ are specifically calculated.

A laser device based on this approach, if at all possible to realize in a practical sense, would appear to be limited to a narrow range of specialized applications.

In a paper entitled "Doped Nanocrystals of Semiconductors-A New Class of Luminescent Materials", The 1993 International Conference on Luminescence, TH1B-2, Aug. 9–13, 1993, Univ. of Conn., Storrs, Conn., R. N. Bhargava reports the incorporation of a luminescent center ($Mn^{2+}$) in nanosize (30Å–70Å) particles of ZnS. The nanosize ZnS particles are said to show an increased energy bandgap due to quantum confinement, which is also said to effect the recombination kinetics of the $Mn^{2+}$ luminescence. The 1.7 millisecond $Mn^{2+}$ decay time in the bulk is reported to be shortened to about 3 nanoseconds after several hours of curing with UV radiation (300 nm).

In this regard reference is also made to publication entitled "Optical Properties of Manganese-Doped Nanocrystals of ZnS", Physical Review Letters, Vol. 72, No. 3, pgs. 416–419, Jan. 17, 1994, by R. N. Bhargava and D. Gallagher.

Both of these publications describe a method of doping ZnS nanocrystals with Mn.

Reference is also made to the following three U.S. Patents, all of which disclose and claim inventions that were made by the inventor of the invention disclosed in this patent application: U.S. Pat. No. 5,157,674, issued Oct. 20, 1992, entitled "Second Harmonic Generation and Self Frequency Doubling Laser Materials Comprised of Bulk Germanosilicate and Aluminosilicate Glasses"; U.S. Pat. No. 5,233,621, issued Aug. 3, 1993, which is a division of the previous patent; and U.S. Pat. No. 5,253,258, issued Oct. 12, 1993, entitled "Optically Encoded Phase Matched Second Harmonic Generation Device and Self Frequency Doubling Laser Material Using Semiconductor Microcrystallite Doped Glasses".

OBJECTS OF THE INVENTION

It is an object of this invention to provide an optical gain medium this is comprised of doped semiconductor nanocrystals, in combination with high index of refraction contrast radiation scatters, that provides laser-like activity when excited from a source of excitation energy.

It is a further object of this invention to provide a device that exhibits laser-like activity when excited by a source of excitation energy, the device including an optical gain medium that is comprised of a matrix phase that is substantially transparent at wavelengths of interest, a doped semiconductor nanocrystal electromagnetic radiation emitting and amplifying phase, and a high index of refraction contrast electromagnetic radiation scattering phase.

It is another object of this invention to provide an optical gain medium this is comprised of doped semiconductor nanocrystals, in combination with high index of refraction contrast radiation scatterers, that is capable of providing laser-like activity when excited by a source of excitation energy, wherein at least one dimension of a body, layer, or coating comprised of the gain medium may be less than a scattering length associated with the radiation scatterers.

It is one further object of this invention to provide an optical gain medium wherein a Tyndall Resonance condition is optically induced into a semiconductor nanocrystal that includes at least isoelectronic dopant atom.

SUMMARY OF THE INVENTION

The foregoing and other problems are overcome and the objects of the invention are realized by an optical gain medium which, in accordance with a first aspect of this invention, is a multi-phase system wherein: a first phase is an electromagnetic radiation emitting and amplifying phase that is comprised of doped semiconductor nanocrystals; a second phase is an electromagnetic radiation scattering phase; and a third phase is a substantially transparent (at the wavelengths of interest) matrix phase.

By example, the emission phase may consist of ZnS nanoparticles that are doped with $Mn^{2+}$, the scattering phase may comprise $TiO_2$ or $Al_2O_3$ particles, and the matrix phase may comprise a glass or polymer body, layer or coating.

Further by example, the emission phase may consist of ZnS nanoparticles that are doped with $Mn^{2+}$, the matrix phase may comprise a glass or polymer body, layer or coating, and the scattering phase may comprise defects, voids, and the like within the matrix phase, either alone or in combination with $TiO_2$ or $Al_2O_3$ particles.

Further by example, the emission phase may consist of ZnS nanoparticles that are doped with $Mn^{2+}$, the scattering phase may comprise the doped ZnS nanoparticles, either alone or in combination with $TiO_2$ or $Al_2O_3$ particles, and the matrix phase may comprise a glass or polymer body, layer or coating.

In accordance with an aspect of this invention, at least one dimension of a body, layer, or coating comprised of the gain medium may be less than a scattering length associated with the scattering phase.

In one embodiment of this invention laser-like activity is generated in a laser-excited glass host containing doped semiconductor nanoparticles, for example ZnS and $Mn^{2+}$, and high index contrast nanoparticles, for example $TiO_2$ or $Al_2O_3$. This gain medium exhibits many of the properties of an efficient laser source, and has a nearly thresholdless input-output behavior. The emission from the optically pumped gain medium is shown to exhibit a slope change in its linear input-output characteristics above a critical pump pulse energy. The change in slope is accompanied by a significant narrowing of the output spectral linewidth, thus substantiating the occurrence of laser-like behavior and not mere fluorescent or luminescent behavior.

Significantly, the dimensional restrictions inherent in the prior art are overcome. It is shown that the laser-like activity occurs when the gain medium has a dimension that is only slightly larger than, equal to, or even less than the scattering length of photons in the medium. This is in sharp contrast to the dimensional requirements predicted by Letokhov et al., as described previously.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

Figure 1:
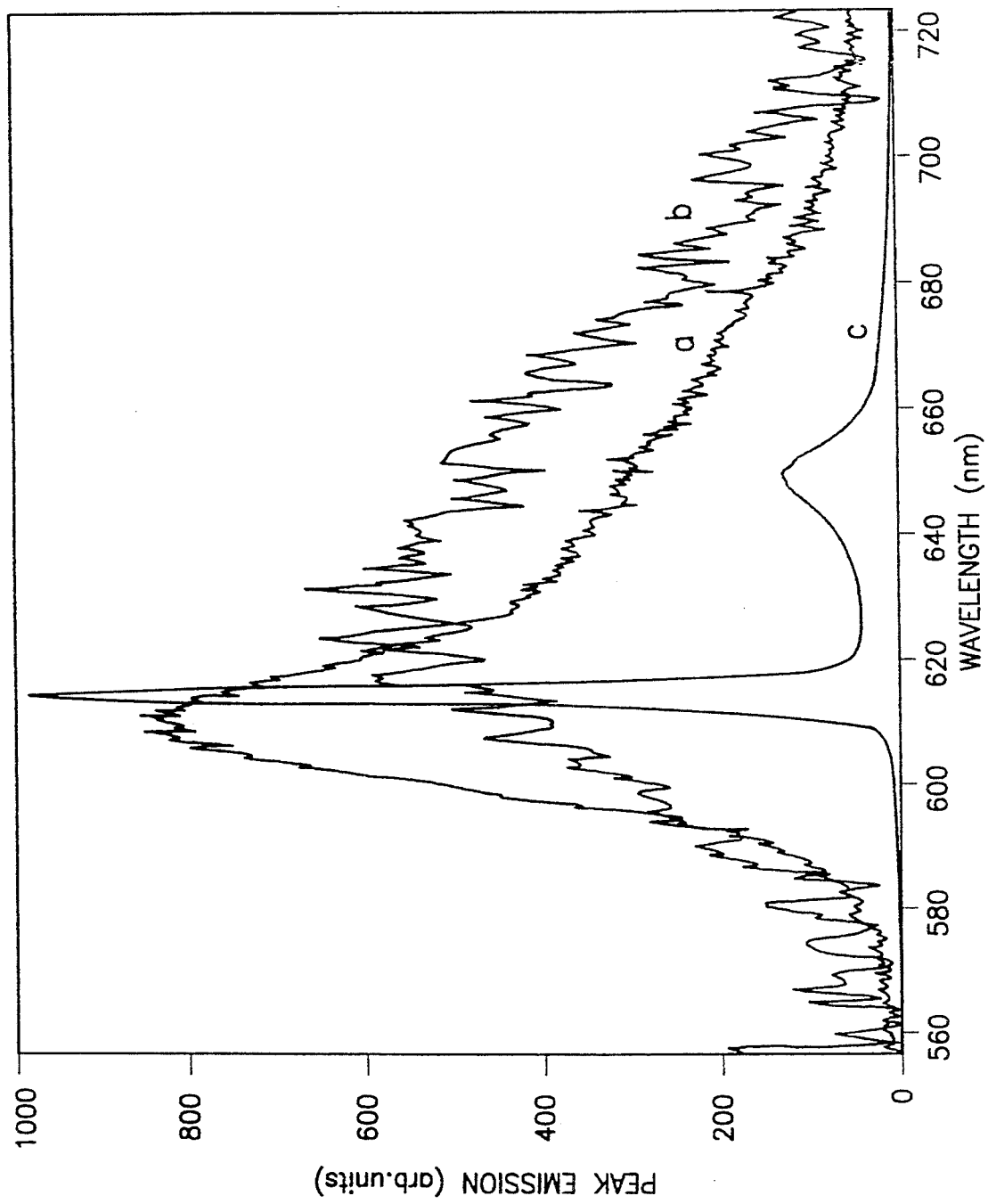
FIG. 1 graphically illustrates three different emission spectrums that were obtained using (a) a pure dye excited by an excitation source; (b) the dye in combination with scattering particles below a threshold excitation; and (c) the dye in combination with scattering particles above the threshold excitation, this graph being useful in describing the doped semiconductor nanocrystallite embodiment of this invention.

This invention relates to an optical gain medium and devices that include the gain medium, the gain medium being capable of exhibiting laser-like activity when excited by a source of excitation energy. The optical gain medium of this invention is comprised of: a matrix phase, for example a glass or a polymer, that is substantially transparent at wavelengths of interest; a doped semiconductor nanocrystal electromagnetic radiation emitting and amplifying phase, for example ZnS nanoparticles doped with luminescent centers such as $Mn^{2+}$; and a high index of refraction contrast electromagnetic radiation scattering phase, such as particles of an oxide and/or scattering centers within the matrix phase, or the doped semiconductor nanocrystals themselves.

This invention is an extension from and an outgrowth of a discovery by the inventor that a chromic dye in combination with scattering particles exhibits electro-optic properties consistent with laser action; i.e., an output emission that exhibits a spectral linewidth collapse and a temporal collapse at an input pump energy above a threshold level.

In this regard experiments were performed on solutions containing a $1 \times 10^{-3}$M to $2.5 \times 10^{-3}$M concentration of rhodamine 640 dye in methanol with varying amounts of either $TiO_2$ (rutile) or $Al_2O_3$ ($\alpha$-phase) nanoparticles. The TiO$_2$ particles had a mean diameter of 250 nm and the Al$_2$O$_3$ particles were either 280 nm or 33 nm in diameter. The TiO$_2$ particles were coated with a layer of Al$_2$O$_3$ to prevent flocculation.

The total surface area available for adsorption of the dye molecules to the nanoparticles was determined. Specifically, it was found that the TiO$_2$ particles had a 13.4 m$^2$/gram available surface area for accommodating dye molecules. This value indicates that at a particle density $\rho \sim 10^{10}$/cm$^3$, approximately 1% of the dye molecules of a $2.5 \times 10^{-3}$M dye solution can be accommodated on the nanoparticle surfaces. This upper limit effectively eliminates the possibility that surface effects play a significant role in the observed laser-like properties of the colloidal solution.

The optical scattering properties of the nanoparticles were in the Mie regime. The scattering cross-sections at the peak dye emission wavelength of $\sim 617$ nm were computed using the full Mie solutions and found to be far too small to exhibit any morphological resonances. This is believed to be primarily due to the small size parameter, $x = ka$, where k is the emission wavevector in methanol and a is the particle radius. Using refractive index values of 2.62, 1.77 and 1.33 for TiO$_2$, Al$_2$O$_3$ and methanol, respectively, scattering cross-section values of $1.86 \times 10^{-9}$ cm$^2$, $1.13 \times 10^{-9}$ cm$^2$ and $1.0 \times 10^{-13}$ cm$^2$ were determined for the TiO$_2$ and the two sizes of Al$_2$O$_3$ particles, respectively.

A transparent (at the wavelengths of interest) cell contained a solution having nanoparticle methanol colloids impregnated with rhodamine 640 perchlorate at concentrations in the 10$^{-3}$M range. The cell had nominal dimensions of 1 cm $\times$ 1 cm $\times$ 1 cm. These cell dimensions were selected for convenience in conducting the experiments. That is, and as will be described below, these cell dimensions are not to be construed as a limitation upon the practice of this invention.

The solution was optically pumped off-axis by linearly polarized 532 nm radiation from a frequency doubled Nd:YAG laser operating at 1.064 mm. Experiments were performed with either a Q-switched laser which produced single 7 nanosecond pulses, or with a Q-switched and mode-locked laser which produced a 125 nanosecond long train containing nine 80 picosecond long pulses. The 532 nm radiation was found to have a 50 $\mu$m small signal penetration depth into a $2.5 \times 10^{-3}$M solution of pure dye in methanol, making it smaller than the shortest optical scattering lengths (ls) used in any of the experiments. The area of the laser spot at the incident face of the cell was measured to be $2.5 \times 10^{-2}$ cm$^2$ for the 7 nanosecond pulses, and $7.85 \times 10^{-3}$ cm$^2$ for the 80 picosecond excitation. The measurements using the long pulses were performed at a repetition rate of 5 Hz, while the 80 picosecond pulse measurements were performed at a Q-switch rate of 25 Hz. These low repetition rates were used to avoid dye degradation effects. The maximum energy per pulse for the experiments were approximately 10 mJ and 0.12 mJ for the long and short pulses, respectively. The output from the face 10 of the cell was collected using a lens and was sent to an optical multichannel analyzer with a liquid nitrogen cooled CCD array, as well as through a monochromator to a fast photodiode and oscilloscope having a 300 picosecond overall time resolution.

EXAMPLE

A first series of experiments were performed using 7 nanosecond long pulses pumping a $2.5 \times 10^{-3}$M rhodamine 640 perchlorate in methanol solution in the cell. The excitation of the pure dye solution resulted in a spectrum (FIG. 1, trace "a") that exhibited a main peak at 610 nm with a shoulder at 640 nm. This spectrum was found to remain constant for an entire range of pump pulse energies up to 10 mJ. The wavelength integrated fluorescence as a function of pump energy exhibited a saturation behavior with a saturation energy of 0.26 mJ. This saturation energy along with the spot size and pump pulse duration agrees with the saturation intensity given by $I_s \sim h\nu/\sigma_p \tau_{sp} = 0.7$ MW/cm$^2$, where $\sigma_p$ is the pump absorption cross section at 532 nm ($\sigma_p \sim 1.33 \times 10^{-16}$ cm$^2$) and $\tau_{sp}$ is the $S_1 \rightarrow S_0$ spontaneous lifetime (4 nanoseconds).

Similar optical pumping experiments were performed in the methanol-dye solution containing $2.8 \times 10^{10}$ cm$^3$ of the TiO$_2$ nanoparticles. The results of these experiments were strikingly different. The spectrum at the lowest excitations (FIG. 1, trace "b") exhibited a broadening and shifting of the linewidth to 76 nm, as compared to the 36 nm width of the pure dye solution. When the energy of the excitation pulses was increased, the unpolarized emission at $\lambda \sim 617$ nm grew rapidly in amplitude and narrowed significantly (FIG. 1, trace "c"). As the pump energy was increased even further, a bichromatic spectrum was observed.

The colloidal solution containing the TiO$_2$ nanoparticles does not exhibit the strong saturation behavior observed in the pure dye solution. That is, the dye/scattering particle combination was found to provide a non-saturable source of highly monochromatic optical energy.

A well-defined threshold for a change in slope efficiency at 617 nm was found for all of a number of different scattering particle concentrations. When this data was plotted on a logarithmic scale, the result was a characteristic S-shaped curve that is indicative of laser behavior. The curve exhibited a very gentle curvature characteristic of nearly thresholdless laser behaviors, which approaches a straight line when all of the spontaneous emission modes are capable of lasing. Analysis of this line shape data reveals that at the same pump energy where a change in slope in the input/output behaviors is observed, the emission linewidth collapsed rapidly to 4 nm.

The foregoing discovery is applied herein to an optical gain medium that includes doped nanocrystals of semiconductors in combination with scattering particles or sites. More particularly, the optical gain medium is comprised of an isoelectronic impurity (such as Mn) in combination with Group II-VI passivated nanocrystals, and also scattering particles or sites. As but one example, this invention may employ the ZnS:Mn$^{2+}$ material that is described by R. Bhargava in the publications referenced in the Background of the Invention portion of this patent application.

The ZnS:Mn$^{2+}$, doped semiconductor nanocrystal material may be prepared as described by Bhargava.

Figure 3:
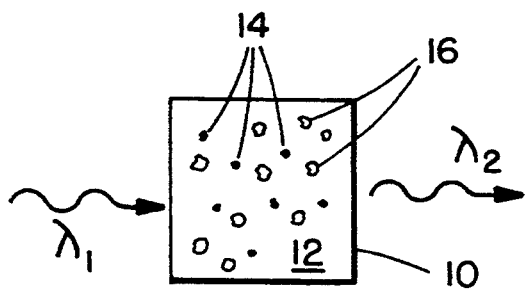
FIG. 3 illustrates a cross-sectional view (not to scale) of a first embodiment of a monolithic body comprised of the gain medium of this invention.

FIG. 3 illustrates a first embodiment of this invention wherein a monolithic structure 10 is comprised of a matrix 12, scattering particles 14, and the doped semiconductor nanocrystals 16. In this embodiment of the invention the scattering particles 14 are comprised of an oxide, by example TiO$_2$ or AlO$_3$, and the doped semiconductor nanocrystals 16 are comprised of, by example ZnS:Mn$^{2+}$. The nanocrystals 16 and scattering particles 14 are embedded within and distributed throughout the matrix 12. The matrix 12 is comprised of a material that is substantially transparent at the wavelengths of interest. Two suitable materials are glasses and polymers, such as PMMA.

Figure 2:
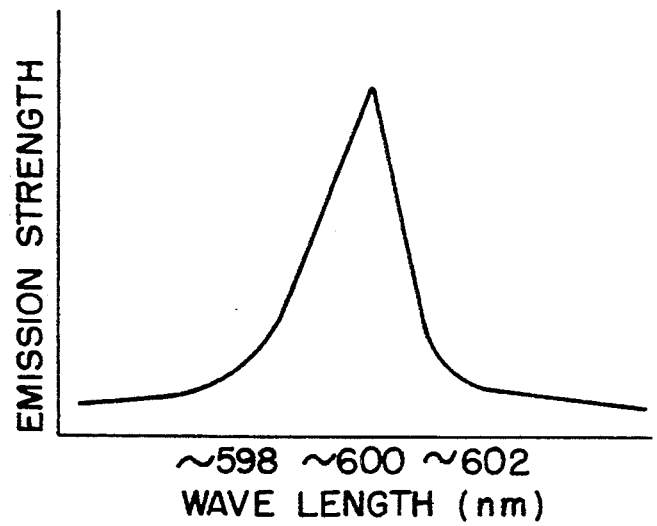
FIG. 2 is a graph that depicts an expected emission spectrum from the gain medium of this invention.

In response to incident pump radiation ($\lambda_1$), the doped nanocrystals 16 emit radiation with a wavelength of $\lambda_2$, the emitted radiation is scattered by the particles 14 in accordance with teaching of this invention, and a laser-like emission results from the structure 10. The laser-like emission resembles that depicted in FIG. 2, and has a narrow spectral bandwidth around a wavelength associated with the luminescent centers ($Mn^{2+}$). For an excitation beam having a predetermined pulsewidth, the temporal duration of the emission may be significantly smaller than the predetermined pulsewidth.

Figure 4:
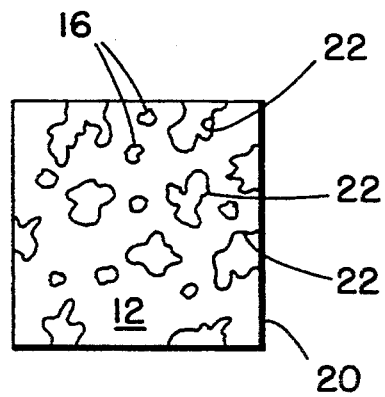
FIG. 4 illustrates a cross-sectional view (not to scale) of a second embodiment of a monolithic body comprised of the gain medium of this invention.

FIG. 4 shows a further embodiment of the invention wherein a structure 20 is comprised of the matrix 12 and the doped semiconductor nanocrystals 16. In this embodiment of the invention the scattering particles 14 are replaced by scattering sites, such as voids 22 within the matrix 12. A porous glass or a porous polymer are both suitable materials for the matrix 12. If desired, scattering particles 14 can also be added to this embodiment of the invention to supplement the scattering due to the change in the index of refraction between the voids 22 and the surrounding matrix 12.

Figure 5:
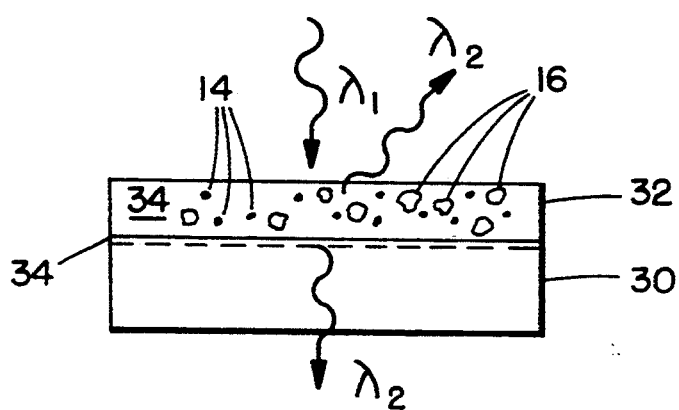
FIG. 5 illustrates a cross-sectional view, not to scale, of an embodiment of this invention wherein a substrate has a layer or coating comprised of the gain medium of this invention.

Reference is now made to FIG. 5 for a further embodiment of the invention. A substrate 30 has a layer 32 formed on a surface thereof. The layer 32 is comprised of a matrix 34 (which may identical to the matrix material 12 of FIGS. 2 and 3), scattering particles and/or sites 14, and doped semiconductor nanocrystals 16. The layer 32 can be formed by various layer formation techniques, such as sputtering. The layer 32 can also be applied in a liquid or semi-liquid form and subsequently cured to immobilize the scattering particles 14 and the doped semiconductor nanocrystals 16.

In response to the pump radiation beam ($\lambda_1$) the layer 32 emits radiation within a narrow band around $\lambda_2$. If the substrate 30 is substantially transparent at the wavelengths of interest the emission from the layer 32 can also be obtained from the backside, non-illuminated surface.

If desired, a reflective or partially reflective coating 34 can be employed between the substrate 30 and the layer 32 to enhance the emission from the topside, illuminated surface of the structure.

In accordance with an aspect of this invention, at least one dimension of the monolithic structures of FIGS. 3 and 4, or the thickness of the layer 32 of FIG. 5, can be made to be less than, or on the order of, the photon scattering length that is associated with the scattering particles 14 and/or scattering sites. This is in sharp contrast to the dimensional requirements predicted by Letokhov et al., as described previously.

In further embodiments of this invention the optical gain medium can be incorporated within a surface region of a substrate, instead of on the surface of the substrate.

It is also within the scope of the invention to employ the doped semiconductor nanocrystals as the emission and amplification phase of the gain medium, and also as the photon scattering phase of the gain medium.

It is pointed out that embodiments of this invention that are disposed upon or within a substrate can be used as pixels for a display screen. Each pixel can be excited by a source of optical energy, such as a laser, or by an electron beam as is commonly done in television and display monitor applications using conventional phosphors. Below a threshold energy the emission is broadened and shifted, as depicted in FIG. 1, trace "b", while above the threshold energy (FIG. 1, trace "c") the emission collapses to within a narrow, nearly monochromatic, wavelength range that is visually perceived as a brilliant, almost pure color.

In accordance with a further aspect of this invention there is provided an optical gain medium that employs a material having an optically-induced Tyndall Resonance to enhance the radiative decay rates and gain in semiconductor nanoparticles.

That is, the inventor has discovered that the Tyndall Resonance phenomenon, usually associated with small metallic particles such as gold, can be optically induced into nanoparticles of a semiconductor that includes a small number, for example one or two, of isoelectronic dopant atoms. The induced Tyndall Resonance operates to greatly enhance the strength of the coupling of the dopant atoms to an external electromagnetic field and, as a result, significantly enhances the radiative decay rate and gain.

By example, a solution containing gold particles having a diameter $d << \lambda$ will appear to have a reddish tint. This is because the particles strongly absorb light in the green/yellow portion of the spectrum, whereas larger particles will reflect this light and appear to have the well-known coloration associated with gold. This optical effect results from the fact that a small gold (metallic) particle contains a large number of free electrons per unit volume in the conduction band. These electrons can be considered as a plasma that has an associated frequency $\omega_{plasma}$. If an external electromagnetic field has a predetermined frequency (wavelength), the Tyndall Resonance condition is satisfied and the strength of the coupling of the gold particles to the external field is greatly enhanced. This results in the significant absorption of the radiation having frequencies that correspond to a frequency near and below the plasma frequency. In the case of gold the particles strongly absorb, instead of reflect, the wavelengths in the green/yellow band and, as a result, take on a reddish tint.

The inventor has discovered that a Tyndall Resonance condition can be optically induced into a semiconductor particle that may include at least one isoelectronic dopant atom.

In a conventional semiconductor, such as ZnS, the electrons will normally inhabit the valence band and the conduction band will be vacant. Upon the application of energy, such as light for some semiconductors, electrons will be stimulated to move up to the conduction band. When the energy is removed, the electrons will gradually return to the valence band and the energy will be emitted in the form of electromagnetic radiation having a wavelength that is a function of the difference between the valence band energy and the conduction band energy (the bandgap).

The presence of an isoelectronic dopant atom, having energy levels between the valence and conduction bands of the host semiconductor particle, will trap electrons and/or holes and allow the transfer of some of the conduction band electrons back to the valence band, via the dopant atom's radiative emission. In the process the dopant atom will emit a characteristic wavelength $\lambda_{dopant}$. The rate at which the dopant atom(s) transfer the electrons from the conduction band back the valence band is evident in the time constant of the associated radiative decay rate. Typical radiative decay rates are on the order of a millisecond or greater, a rate that is generally incompatible with (too slow) the generation of a low threshold laser-like emission.

However, if several conditions are made to occur the inventor has discovered that a Tyndall Resonance condition can be established for the semiconductor nanoparticle. The Tyndall Resonance condition serves to strongly couple the dopant atoms to the electromagnetic field, which in turn greatly increases the radiative decay rate and gain. As a result, the doped semiconductor nanoparticles become suitable for use in a high gain optical medium that is capable of supporting a laser-like emission, when combined with an electromagnetic scattering phase in accordance with this invention. The aforementioned conditions are as follows.

First, the diameter of the semiconductor nanocrystal particles is made much less than the wavelength of the electromagnetic radiation field.

Second, only a small number of dopant atoms is associated with each semiconductor nanoparticle. The fulfillment of this condition results in an accumulation of free electrons in the conduction band and holes in the valence band, and the formation of a plasma (similar to the gold particles described above) that has an associated frequency $\omega_{plasma}$. If, instead, a significant number of dopant atoms are associated with the semiconductor nanoparticle, then the number of free electrons in the conduction band is not sufficient to form the plasma.

Third, the surface of the semiconductor nanoparticle is passivated (insulated), such as by applying a coating, so as to prevent the loss of the conduction band electrons to non-radiative or long-lived surface states at the semiconductor particle's interface.

When these conditions are fulfilled it can be shown that when $\omega_{plasma}$, divided by the square root of 3, is approximately equal to $\omega_{dopant}$ that a Tyndall Resonance occurs. The occurrence of the Tyndall Resonance causes a strong coupling of the dopant atoms to the electromagnetic field, and results in a dramatic increase in the radiative decay rate and gain.

As such, it can be seen that an aspect of this invention is a method for generating electromagnetic radiation by the steps of: (a) providing a sample comprised of a plurality of semiconductor nanocrystals that are doped with atoms of a selected dopant species; (b) irradiating the sample with electromagnetic radiation having energy suitable for raising electrons from a valence band to a conduction band of the doped semiconductor nanocrystals; and (c) using the electromagnetic radiation to induce a Tyndall Resonance condition within at least some of the doped semiconductor nanocrystals such that a radiative decay rate of the atoms of the selected dopant species is increased.

A further aspect of this invention provides a method of broadening and shifting a band of emission wavelengths from a plurality of doped semiconductor nanocrystals by the steps of: (a) providing a sample comprised of a plurality of the doped semiconductor nanocrystals in combination with a plurality of scattering particles or sites and a medium that is substantially transparent to the band of emission wavelengths; (b) irradiating the sample with electromagnetic radiation having wavelengths suitable for generating an emission from the doped semiconductor nanocrystals; and (c) broadening and shifting a band of emission wavelengths from the plurality of doped semiconductor nanocrystals by scattering the emission with the scattering particles or sites.

While this invention has been particularly shown and described with respect to preferred embodiments thereof, it will be understood by those skilled in the art that changes in form and details may be made therein without departing from the scope and spirit of the invention.

What is claimed is:

1. A structure that exhibits laser-like activity when excited by a source of excitation energy, the structure comprising in combination:
    a matrix phase that is substantially transparent at wavelengths of interest;
    a doped semiconductor nanocrystal electromagnetic radiation emitting and amplifying phase; and
    a high index of refraction contrast electromagnetic radiation scattering phase, wherein said matrix phase, said electromagnetic radiation emitting and amplifying phase, and said electromagnetic radiation scattering phase are commingled within a volume of said structure.

2. A structure as set forth in claim 1, wherein at least one dimension of said structure is less than or on the order of a scattering length associated with the radiation scattering phase.

3. A structure as set forth in claim 1 wherein said doped semiconductor nanocrystal electromagnetic radiation emitting and amplifying phase is comprised of semiconductor particles that are doped with a luminescent center.

4. A structure as set forth in claim 1 wherein said doped semiconductor nanocrystal electromagnetic radiation emitting and amplifying phase is comprised of ZnS particles that are doped with $Mn^{2+}$.

5. A structure as set forth in claim 1 wherein said high index of refraction contrast electromagnetic radiation scattering phase is comprised of particles of an oxide.

6. A structure as set forth in claim 1 wherein said high index of refraction contrast electromagnetic radiation scattering phase is comprised of $TiO_2$.

7. A structure as set forth in claim 1 wherein said high index of refraction contrast electromagnetic radiation scattering phase is comprised of $Al_2O_3$.

8. A structure as set forth in claim 1 wherein said high index of refraction contrast electromagnetic radiation scattering phase is comprised of scattering centers within said matrix phase.

9. A structure as set forth in claim 1 wherein said matrix phase is comprised of a material selected from the group consisting essentially of a glass and a polymer.

10. A structure as set forth in claim 1, wherein said structure has the form of a monolithic body.

11. A structure as set forth in claim 1, wherein said structure has the form of a layer that overlies a surface of a substrate.

12. A structure as set forth in claim 1, wherein said structure has the form of a region that is formed within a surface of a substrate.

13. A device that outputs electromagnetic radiation within a first band of wavelengths when excited by electromagnetic radiation having wavelengths within a second band of wavelengths, the device comprising:
    a gain medium comprised of a matrix phase that is substantially transparent at wavelengths of interest, a doped semiconductor nanocrystal electromagnetic radiation emitting and amplifying phase, and an electromagnetic radiation scattering phase, wherein said matrix phase, said electromagnetic radiation emitting and amplifying phase, and said electromagnetic radiation scattering phase are commingled within a volume of said gain medium.

14. A device as set forth in claim 13, wherein at least one dimension of said gain medium is less than or on the order of a scattering length associated with the radiation scattering phase.

15. A device as set forth in claim 13 wherein said doped semiconductor nanocrystal electromagnetic radiation emitting and amplifying phase is comprised of semiconductor particles that are doped with a luminescent center.

16. A device as set forth in claim 13 wherein said doped semiconductor nanocrystal electromagnetic radiation emitting and amplifying phase is comprised of ZnS particles that are doped with $Mn^{2+}$.

17. A device as set forth in claim 13 wherein said electromagnetic radiation scattering phase is comprised of particles of an oxide.

18. A device as set forth in claim 17 wherein said electromagnetic radiation scattering phase is comprised of an oxide selected from the group consisting essentially of $TiO_2$ and $Al_2O_3$.

19. A device as set forth in claim 13 wherein said electromagnetic radiation scattering phase is comprised of scattering centers within said matrix phase.

20. A device as set forth in claim 13 wherein said matrix phase is comprised of a material selected from the group consisting essentially of a glass and a polymer.

21. A device as set forth in claim 13, wherein said gain medium is embodied as one of: a monolithic structure, a coating, a layer, and a region within a host structure.

22. A method of broadening and shifting a band of emission wavelengths from a plurality of doped semiconductor nanocrystals, comprising the steps of:
providing a sample comprised of a plurality of the doped semiconductor nanocrystals in combination with (a) a plurality of scattering particles or sites and (b) a medium that is substantially transparent to the band of emission wavelengths;
irradiating the sample with electromagnetic radiation having wavelengths suitable for generating an emission from the doped semiconductor nanocrystals; and
broadening and shifting a band of emission wavelengths from the plurality of doped semiconductor nanocrystals by scattering the emission with the scattering particles or sites.

23. A method as set forth in claim 22, wherein at least one dimension of said sample is provided to be less than or on the order of a scattering length associated with the scattering particles or sites.

24. A method as set forth in claim 22, wherein the sample is comprised of semiconductor nanocrystals that are doped with a luminescent center.

25. A method as set forth in claim 22, wherein the sample is provided with doped semiconductor nanocrystals that are comprised of ZnS nanocrystals that are doped with $Mn^{2+}$.

26. A method for generating electromagnetic radiation, comprising the steps of:
providing a sample comprised of a plurality of semiconductor nanocrystals that are doped with a selected dopant;
irradiating the sample with electromagnetic radiation having energy suitable for raising electrons from a valence band to a conduction band of the doped semiconductor nanocrystals; and
using the electromagnetic radiation to induce a Tyndall Resonance condition within at least some of the doped semiconductor nanocrystals such that a radiative decay rate of the selected dopant is increased.

27. A method as set forth in claim 26, wherein the sample is also provided to have a plurality of scattering particles or sites and a medium that is substantially transparent to a band of emission wavelengths from the selected dopant.

28. A method as set forth in claim 27, wherein at least one dimension of said sample is provided to be less than or on the order of a scattering length associated with the scattering particles or sites.

29. A method as set forth in claim 26 wherein the semiconductor nanocrystals are provided to have a number of atoms of a selected dopant species that insures that a number of electrons in the conduction band is sufficient to form a plasma having an associated frequency $\omega_{plasma}$, divided by the square root of 3, that is approximately equal to a frequency $\omega_{dopant}$ that is associated with the radiative decay emission from the atoms of the selected dopant species.

30. A method as set forth in claim 26 wherein the semiconductor nanocrystals are provided so as to have a passivated surface.

31. A method as set forth in claim 26 wherein the semiconductor nanocrystals are provided to have a diameter that is much less than a dimension of wavelengths associated with the electromagnetic radiation that irradiates the sample.

32. A method as set forth in claim 26 wherein the dopant is comprised of one or more isoelectronic atoms.

33. A method as set forth in claim 26, wherein the sample is comprised of semiconductor nanocrystals that are doped with a luminescent center.

34. A method as set forth in claim 26, wherein the sample is comprised of comprised of ZnS nanocrystals that are doped with $Mn^{2+}$.

35. A display device, comprising:
a substrate; and
a plurality of display pixels formed upon or within a surface of said substrate, each of said display pixels comprising a gain medium comprised of a matrix phase that is substantially transparent at wavelengths of interest, a doped semiconductor nanocrystal electromagnetic radiation emitting and amplifying phase, and an electromagnetic radiation scattering phase, wherein said matrix phase, said electromagnetic radiation emitting and amplifying phase, and said electromagnetic radiation scattering phase are commingled within a volume of said gain medium.

36. A display device as set forth in claim 35, wherein at least one dimension of each of said pixels is less than or on the order of a scattering length associated with the radiation scattering phase.

37. A display device as set forth in claim 35, wherein said doped semiconductor nanocrystal electromagnetic radiation emitting and amplifying phase is comprised of semiconductor particles that are doped with a luminescent center.

38. A display device as set forth in claim 35, wherein said doped semiconductor nanocrystal electromagnetic radiation emitting and amplifying phase is comprised of ZnS particles that are doped with $Mn^{2+}$.

39. A display device as set forth in claim 35, wherein said electromagnetic radiation scattering phase is comprised of particles of an oxide.

40. A display device as set forth in claim 35, and further comprising means for irradiating said plurality of pixels with an optical beam or an electron beam.

41. An optical emitter comprising:
a substrate; and
a first thin film disposed over a surface of said substrate; wherein
    said first thin film is comprised of a first optical gain medium comprised of a first optical emitter in combination with a plurality of scattering centers for emitting, in response to excitation by a pulse of electromagnetic radiation having a first range of wavelengths centered about a first wavelength, a first temporally and spectrally collapsed pulse of electromagnetic radiation having a second range of wavelengths centered about a second wavelength, wherein said first optical emitter is comprised of first semiconductor particles that are doped with a luminescent center.

42. An optical emitter as set forth in claim 41 and further comprising:
a second thin film disposed over said surface of said substrate; wherein
    said second thin film is comprised of a second optical gain medium comprised of a second optical emitter in combination with a plurality of scattering centers for emitting, in response to excitation by said pulse of electromagnetic radiation having said first range of wavelengths centered about said first wavelength, a second temporally and spectrally collapsed pulse of electromagnetic radiation having a third range of wavelengths centered about a third wavelength, wherein said second wavelength is different than said third wavelength, and wherein said second optical emitter is comprised of second semiconductor particles that are doped with a luminescent center.

43. An optical emitter as set forth in claim 42, wherein surfaces of said first semiconductor particles and said second semiconductor particles are passivated.

44. An optical emitter as set forth in claim 42, and further comprising a first reflective region that is interposed between said first thin film and said surface of said substrate; and a second reflective region that is interposed between said second thin film and said surface of said substrate.

* * * * *